(12) United States Patent
Yuan et al.

(10) Patent No.: US 8,514,573 B2
(45) Date of Patent: Aug. 20, 2013

(54) SERVER CENTER WITH HEAT DISSIPATION SYSTEM

(75) Inventors: Guang-Dong Yuan, Shenzhen (CN); Hai-Qing Zhou, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 306 days.

(21) Appl. No.: 13/040,236

(22) Filed: Mar. 3, 2011

(65) Prior Publication Data

US 2012/0170196 A1    Jul. 5, 2012

(30) Foreign Application Priority Data

Dec. 30, 2010    (CN) .......................... 2010 1 0614749

(51) Int. Cl.
*H05K 7/20*    (2006.01)

(52) U.S. Cl.
USPC .......................................... 361/695; 454/184

(58) Field of Classification Search
None
See application file for complete search history.

(56) References Cited

U.S. PATENT DOCUMENTS

| | | | |
|---|---|---|---|
| 6,283,380 B1* | 9/2001 | Nakanishi et al. | 236/49.3 |
| 6,639,794 B2* | 10/2003 | Olarig et al. | 361/679.48 |
| 7,508,663 B2* | 3/2009 | Coglitore | 361/695 |
| 2008/0037217 A1* | 2/2008 | Murakami et al. | 361/695 |
| 2012/0069514 A1* | 3/2012 | Ross | 361/679.33 |
| 2012/0083196 A1* | 4/2012 | Mockridge | 454/184 |

* cited by examiner

*Primary Examiner* — Gregory Thompson
(74) *Attorney, Agent, or Firm* — Altis Law Group, Inc.

(57) ABSTRACT

An exemplary server center includes a server, a heat dissipating system, and temperature controlling device. The heat dissipating system includes an exhaust fan, and an airflow tunnel connecting the exhaust fan with the server. The temperature controlling device includes a temperature sensor electrically connected to the server, and an airflow valve mounted on the airflow tunnel. The temperature sensor is configured for detecting a temperature of the server and controlling the airflow valve to permit the airflow enter the airflow tunnel or not, according to the temperature obtained from the server.

11 Claims, 1 Drawing Sheet

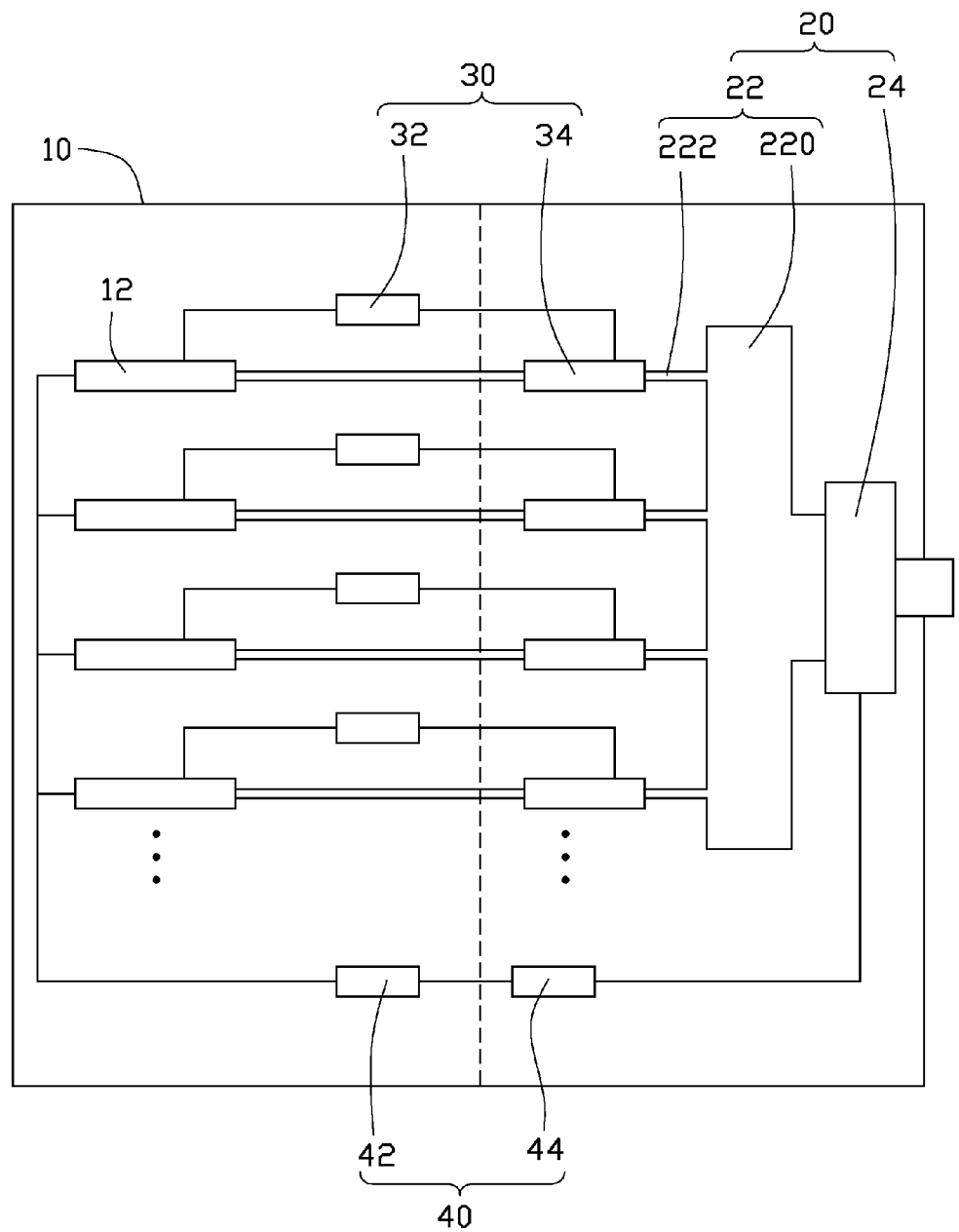

SERVER CENTER WITH HEAT DISSIPATION SYSTEM

BACKGROUND

1. Technical Field

The present disclosure relates to server centers, and particularly to a server center with effective heat dissipation.

2. Description of Related Art

A server center generally includes a rack and a plurality of servers stacked on the rack. When the servers are working, they generate a large amount of heat, and therefore effective heat dissipation is necessary.

A typical heat dissipating system provided to the server center includes a fan, and an airflow tunnel connecting the fan with the servers. Airflow generated by the fan flows through the airflow tunnel and through the servers, and is expelled to an outer environment, whereby heat generated by the servers is dissipated. However, sometimes some of the servers are not working, and the airflow generated by the fan still flows through these servers. This wastes energy.

What is needed, therefore, is a server center which can overcome the above-described problems.

BRIEF DESCRIPTION OF THE DRAWINGS

Many aspects of the present embodiment(s) can be better understood with reference to the accompanying drawing. The components in the drawing are not necessarily drawn to scale, the emphasis instead placed upon clearly illustrating the principles of the present embodiment(s). Moreover, in the drawing, like reference numerals designate corresponding parts throughout the whole view.

The drawing is a schematic view of a server center in accordance with an embodiment of the disclosure.

DETAILED DESCRIPTION

Referring to the drawing, a server center in accordance with an embodiment of the disclosure is shown. The server center comprises a server room 10, a plurality of servers 12, a heat dissipating system 20, a plurality of temperature controlling devices 30, and a power controlling device 40. The servers 12 are disposed in the server room 10 and aligned with each other.

The heat dissipating system 20 comprises an airflow tunnel 22, and an exhaust fan 24 connected to the airflow tunnel 22. In this embodiment, the exhaust fan 24 is a dual standby exhaust fan. The airflow tunnel 22 comprises a main tunnel 220, and a plurality of branch tunnels 222 respectively extending from the main tunnel 220. The main tunnel 220 is fluidly connected to the exhaust fan 24, and the branch tunnels 222 are correspondingly fluidly connected to the servers 12. In other words, the servers 12 are respectively disposed at airflow inlets of the branch tunnels 222 of the airflow tunnels 22, and the exhaust fan 24 is disposed at an airflow outlet of the main tunnel 220 of the airflow tunnel 22.

Each of the temperature controlling devices 30 comprises a temperature sensor 32 electrically connected to a corresponding server 12, and an airflow valve 34 mounted in a corresponding branch tunnel 222. The temperature sensor 32 is used for detecting a temperature of the corresponding server 12. Airflow drawn by the exhaust fan 24 flows from the corresponding server 12, through the airflow valve 34, and then through the corresponding branch tunnel 222 and the main tunnel 220 to an outer environment.

Each temperature sensor 32 is electrically connected to a corresponding airflow valve 34. The temperature sensor 32 is used for controlling the corresponding airflow valve 34 to permit air from the corresponding server 12 to enter the corresponding branch tunnel 222 or bar (block) air from the corresponding server 12 from entering the corresponding branch tunnel 222, according to the temperature obtained from the corresponding server 12. In particular, the temperature sensor 32 reads a temperature of the corresponding server 12, and sends a corresponding signal to the corresponding airflow valve 34. In more detail, when the temperature of the corresponding server 12 is lower than a predetermined threshold value, the corresponding airflow valve 34 is controlled to be closed; and when the temperature of the corresponding server 12 is equal to or higher than the predetermined threshold value, the corresponding airflow valve 34 is controlled to be opened.

The power controlling device 40 electrically connects the servers 12 with the exhaust fan 24. The power controlling device 40 comprises a data acquisition member 42 and a controlling member 44. The data acquisition member 42 is used for reading a power consumption of the servers 12, and sending a corresponding signal to the controlling member 44. The controlling member 44 is used for controlling an operating voltage of the exhaust fan 24 according to the power consumption of the servers 12, thereby controlling a rotation speed of the exhaust fan 24. In detail, when the power consumption of the servers 12 is equal to or higher than a predetermined threshold value, the rotation speed of the exhaust fan 24 becomes fast; and when the power consumption of the servers 12 is lower than the predetermined threshold value, the rotation speed of the exhaust fan 24 becomes slow, whereby a power consumption of the exhaust fan 24 can be controlled according to the power consumption of the servers 12.

It is to be understood, however, that even though numerous characteristics and advantages of the present embodiment(s) have been set forth in the foregoing description, together with details of the structures and functions of the embodiment(s), the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A server center comprising:
   a server;
   a heat dissipating system comprising an exhaust fan, and an airflow tunnel connecting the exhaust fan with the server; and
   a temperature controlling device comprising a temperature sensor electrically connected to the server, and an airflow valve mounted in the airflow tunnel, the temperature sensor being configured for detecting a temperature of the server, and for controlling the airflow valve to permit air from the server to enter the airflow tunnel or bar air from the server from entering the airflow tunnel according to the temperature of the server;
   wherein the airflow tunnel comprises a main tunnel and a branch tunnel extending outwardly from the main tunnel.

2. The server center of claim 1, wherein the main tunnel is connected to the exhaust fan, and the branch tunnel is connected to the server.

3. The server center of claim 1, wherein the server is disposed at an airflow inlet of the airflow tunnel, and the exhaust fan is disposed at an airflow outlet of the airflow tunnel.

4. The server center of claim 1, wherein the temperature sensor is configured to control the airflow valve to close when the temperature is lower than a predetermined value.

5. The server center of claim 4, wherein the temperature sensor is configured to control the airflow valve to open when the temperature is equal to or higher than the predetermined value.

6. The server center of claim 1, further comprising a power controlling device, which electrically connects the server with the exhaust fan.

7. The server center of claim 6, wherein the power controlling device comprises a data acquisition member and a controlling member, the data acquisition member is configured for reading a power consumption of the server and sending a corresponding signal to the controlling member, and the controlling member is configured for controlling an operating voltage of the exhaust fan according to the power consumption of the server.

8. The server center of claim 1, wherein when the airflow valve permits air from the server to enter the airflow tunnel, airflow drawn by the exhaust fan flows from the server through the airflow valve and then through the airflow tunnel, and is expelled to an outer environment.

9. The server center of claim 1, wherein the exhaust fan is a dual standby exhaust fan.

10. A server center comprising:
a server room with a plurality of servers positioned therein;
a heat dissipating system comprising an exhaust fan and an airflow tunnel, the airflow tunnel comprising a main tunnel and a plurality of branch tunnels extending from the main tunnel, the main tunnel being connected to the exhaust fan, and the branch tunnels each being connected to a corresponding one of the servers; and
a plurality of temperature controlling devices each comprising a temperature sensor electrically connected to a corresponding one of the servers, and an airflow valve mounted on the corresponding one of the branch tunnels, the temperature sensor being configured for detecting a temperature of the corresponding server and controlling the airflow valve to permit air from the server to enter the corresponding branch tunnel or bar air from the server from entering the corresponding branch tunnel according to the temperature obtained from the server.

11. A server center comprising:
a plurality of servers;
a heat dissipating system comprising an exhaust fan and an airflow tunnel, the airflow tunnel comprising a main tunnel and a plurality of branch tunnels extending from the main tunnel, the main tunnel fluidly communicating with the exhaust fan, and the branch tunnels each fluidly communicating with a corresponding one of the servers; and
a plurality of temperature controlling devices each comprising a temperature sensor electrically connected to a corresponding one of the servers, and an airflow valve mounted on the corresponding one of the branch tunnels, the temperature sensor configured for detecting a temperature of the corresponding server and controlling the airflow valve to open or close according to the temperature obtained from the server.

* * * * *